(12) United States Patent
Lewis et al.

(10) Patent No.: US 6,317,319 B1
(45) Date of Patent: Nov. 13, 2001

(54) LOW-PROFILE COOLING ASSEMBLY FOR THE CPU CHIP OF A COMPUTER OR THE LIKE

(75) Inventors: Jeffrey M. Lewis; Michael R. Rolla, both of Maynard; Robert L. Sullivan, Townnsend, all of MA (US)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 09/626,204

(22) Filed: Jul. 26, 2000

(51) Int. Cl.[7] .................................................. H05K 7/20
(52) U.S. Cl. ........................ 361/695; 361/719; 454/184
(58) Field of Search ........................ 165/80.3, 120–127; 361/687–690, 694–695, 719–720; 454/184

(56) References Cited

U.S. PATENT DOCUMENTS

| | | | |
|---|---|---|---|
| 5,936,836 | * 8/1999 | Scholder | 361/695 |
| 6,141,218 | * 10/2000 | Miyahara | 361/695 |
| 6,205,027 | * 3/2001 | Nakajima | 361/719 |

* cited by examiner

*Primary Examiner*—Gregory Thompson
(74) *Attorney, Agent, or Firm*—Cesari and McKenna

(57) ABSTRACT

A cooling assembly for cooling a CPU on a motherboard in a low profile electronic device. The assembly comprises a channel-shaped heat sink having a flat first wall, an opposite wall, open first and second ends and internal heat exchange fins extending between those walls and ends. An electric blower having an inlet and an outlet is mounted to the heat sink so that the blower outlet is aligned with the first end of the heat sink and the heat sink is anchored to the CPU so that the first wall of the heat sink is flush against the CPU and the blower inlet overhangs an edge of the motherboard. Preferably, a baffle member is mounted to the heat sink to direct heated air from the second end of the heat sink to the atmosphere and to prevent recirculation of that air back to the blower inlet.

7 Claims, 3 Drawing Sheets

LOW-PROFILE COOLING ASSEMBLY FOR THE CPU CHIP OF A COMPUTER OR THE LIKE

BACKGROUND OF THE INVENTION

1. Field of the Invention

This invention relates thin computers such as laptop and notebook computers. It relates especially to a low profile cooling assembly for the CPU chip in such computers.

2. Description of the Prior Art

The components of a computer, telecommunications switch or other microprocessor-based device are usually contained within an enclosure or housing. When the device is powered up, these components become heated. This is particularly so in the case of the device's central processor unit (CPU) which consumes a relatively large amount of electrical power. Therefore, such devices invariably include some means for circulating air through the enclosure to conduct heat away from those components, particularly the CPU chip.

For computers or other devices having a relatively high profile enclosure, it may suffice to provide fans at the perimeter of the enclosure to circulate air through the enclosure. However, for thin computers and devices it is usually necessary to supplement the perimeter fans with a fan or blower which conducts the cooling air directly to and from the CPU chip in the enclosure. While such cooling means operate satisfactorily in a computer enclosure in the order of five or more inches thick and which houses a relatively low power CPU chip, e.g. 70 watts or less, they do not suffice to cool higher rated chips in the low profile computers in use today, i.e. those less than two inches thick.

SUMMARY OF THE INVENTION

Accordingly, it is an object of the present invention to provide an improved cooling assembly for cooling the CPU chip of a microprocessor-based electronic device.

A further object of the invention is to provide a cooling assembly for efficiently cooling a high power-rated CPU chip in a low profile computer.

Another object of the invention is to provide a cooling assembly for conducting heat away from a hot CPU chip located in a relatively thin enclosure.

Still another object of the invention is to provide an assembly of this type for directing a relatively large volume of air per minute past a high power-rated CPU chip housed in a densely packed enclosure.

Other objects will, in part, be obvious and will, in part, appear hereinafter. The invention accordingly comprises the features of construction, combination of elements and arrangement of parts which will be exemplified in the following detailed description, and the scope of the invention will be indicated in the claims.

Briefly, our cooling assembly is designed for use in an enclosure housing at least one CPU chip mounted to a motherboard within the enclosure. Typically, the enclosure has a low profile, e.g. 1.75 inches (1 U); however, it should be understood that aspects of the invention have application for taller enclosures. The assembly includes a thin-fin heat sink mounted directly to the top of the CPU chip, the beat sink being as tall as the enclosure will allow. Built into the heat sink are means to attached a centrifugal blower which is positioned as far away from the CPU as possible in order to maximize the fin length of the heat sink and so as to overhang the edge of the motherboard as much as possible to maximize the inlet opening into the blower.

Cooling air to be pulled into the inlet of the blower is provided by tube-axial fans mounted in a perimeter wall of the enclosure and which flood the interior of the enclosure with ambient air. This air is sucked into the blower and pushed laterally at a high velocity directly across the heat sink fins to draw heat away from the heat sink and thus from the CPU chip.

The assembly also includes flexible air baffles which direct the outlet air from the heat sink smoothly around corners to a tube-axial exhaust fan on the opposite wall of the enclosure from the inlet fans, these air baffles also providing top-to-bottom seals within the enclosure to prevent the heated air exhausting from the heat sink from being recirculated back into the blower.

As will be seen, the cooling assembly is easily installed in an enclosure less than two inches thick and, when installed, it can efficiently cool a CPU chip having a power rating of 80 watts or more.

BRIEF DESCRIPTION OF THE DRAWINGS

For a fuller understanding of the nature and objects of the invention, reference should be made to the following detailed description taken in connection with the accompanying drawings, in which.

DESCRIPTION OF THE PREFERRED EMBODIMENT

Figure 1:
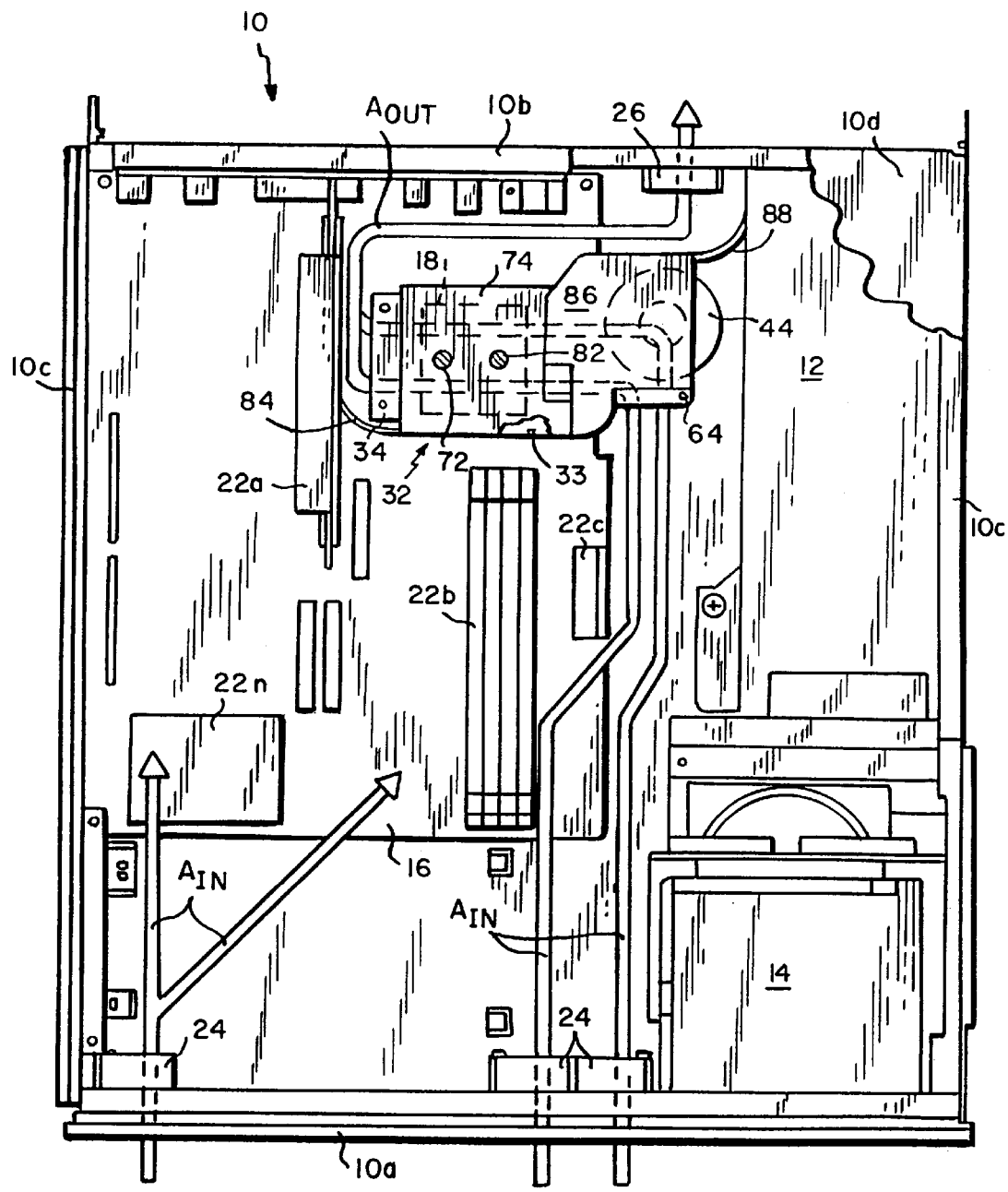
FIG. 1 is a plan view, with parts broken away, of a low profile computer incorporating a cooling assembly according to the invention.
Figure 3:
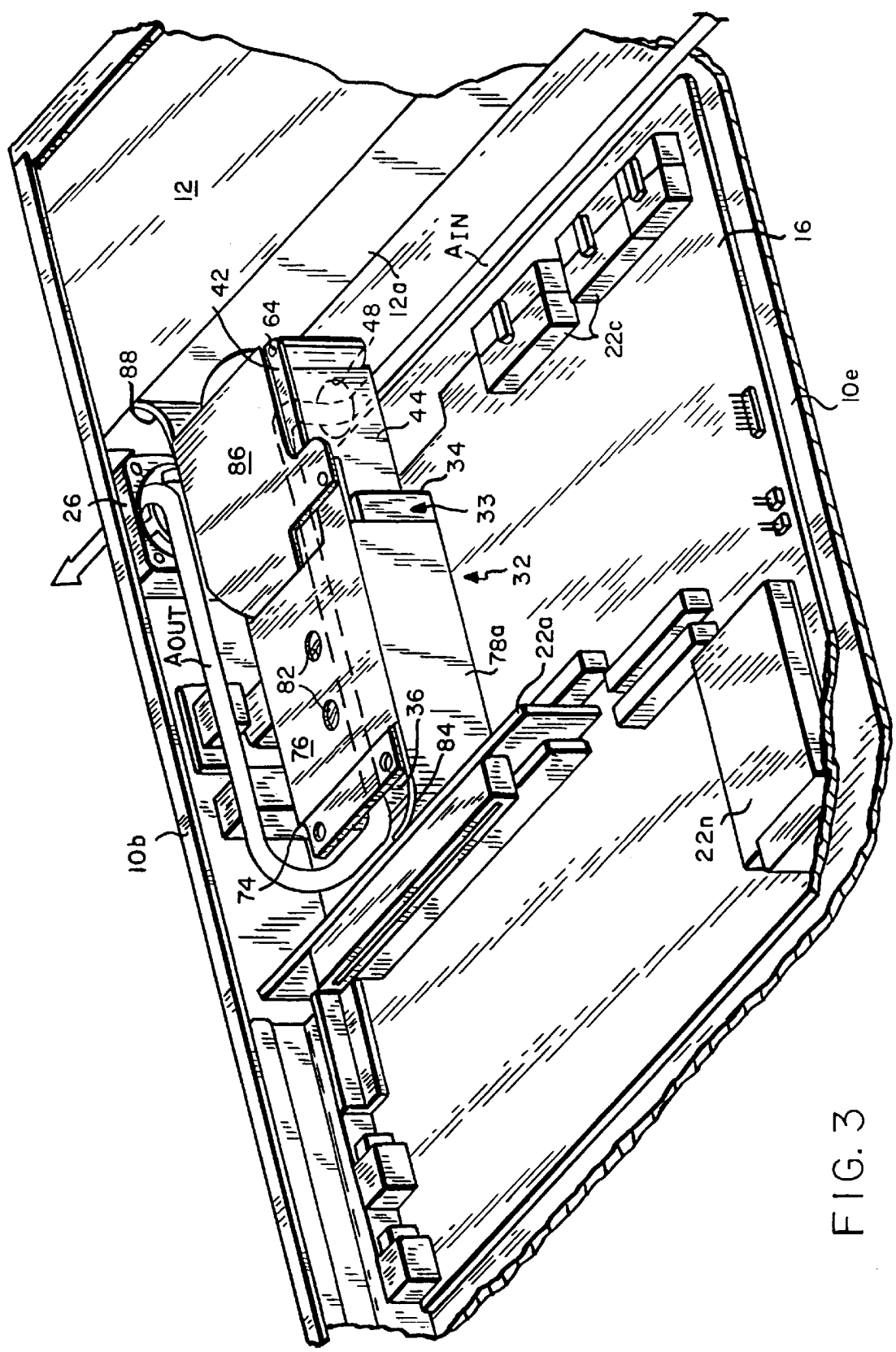
FIG. 3 is a fragmentary perspective view showing the fully assembled cooling assembly.

Refer to FIG. 1 which shows an enclosure indicated generally at 10 which houses the components of a microprocessor-based device, to wit: a computer. Enclosure 10 includes a front wall 10a, a rear wall 10b, a pair of opposite side walls 10c, 10c, as well as a top wall 10d and a bottom wall 10e (FIG. 3). Enclosure 10 is a so-called low profile enclosure having a height or thickness in the order of only two inches or less, e.g. 1 U.

Figure 2:
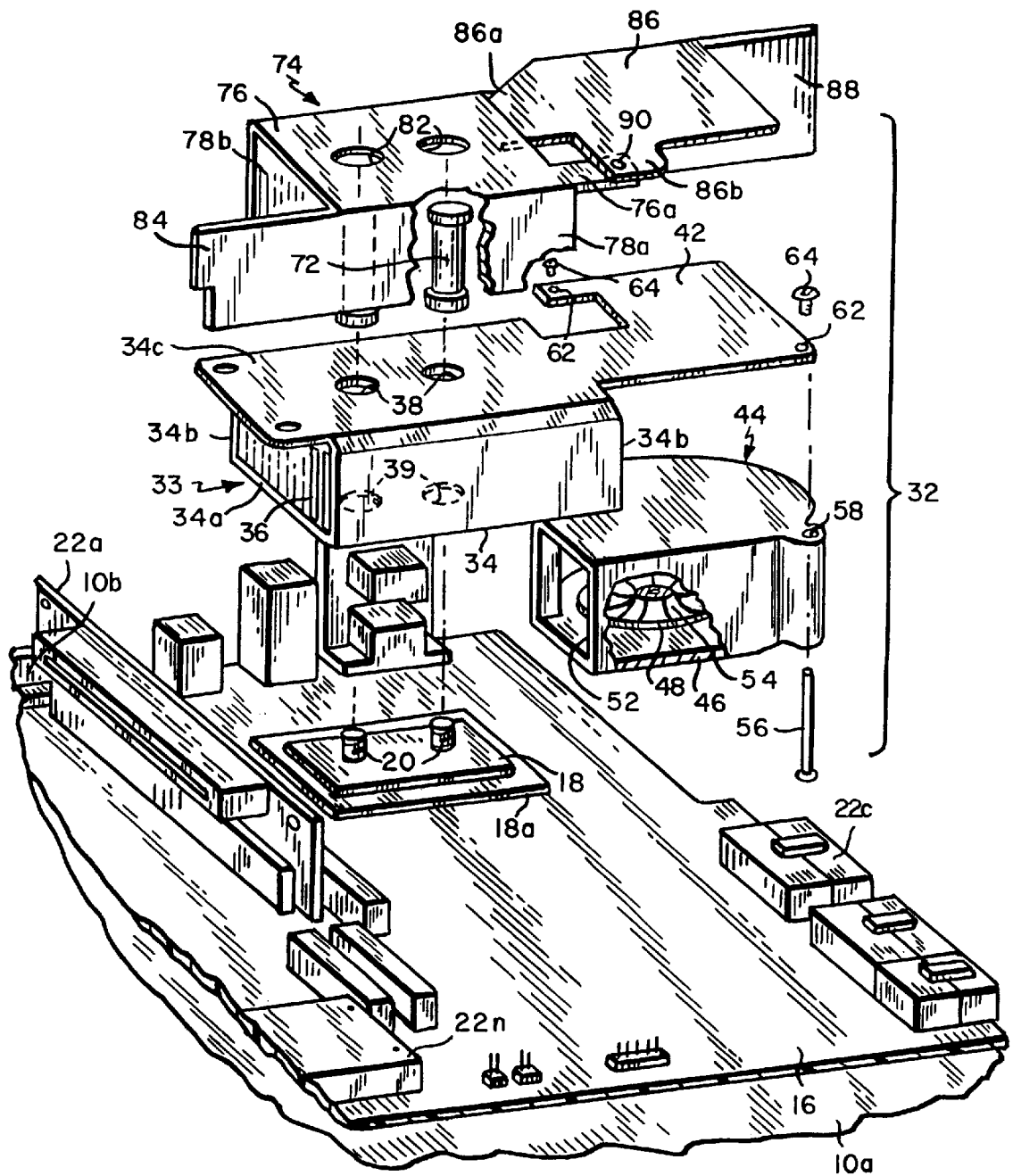
FIG. 2 is a fragmentary exploded perspective on larger scale showing elements of the cooling assembly in greater detail.

The components inside enclosure 10 may include a power supply 12, a disk drive 14, as well as a motherboard 16 supporting a CPU chip 18 as well various other components 22a, 22b, 22c, . . . 22n such as integrated circuits, connectors, etc. Chip 18 is actually mounted to motherboard 16 via a base 18a (FIG. 2). Also, for reasons that will become apparent, a pair of relatively large diameter threaded posts 20 project up from the top of the chip 18. The motherboard also has various printed circuit paths (not shown) electrically interconnecting the various components of the computer.

One or more tube-axial fans 24 are mounted to the enclosure front wall 10a for conducting cooling air into enclosure 10 as shown by the arrows $A_{IN}$ and one or more exhaust or purging fans 26 are mounted to the enclosure rear wall 10b to conduct heated air out of enclosure 10 as shown by arrow $A_{OUT}$.

In accordance with the invention, a low profile cooling assembly shown generally at 32, positioned in enclosure 10 directly above CPU chip 18, utilizes the incoming air streams from fans 24 to very efficiently and effectively conduct heat away from CPU chip 18 so that the chip may have a relatively high power rating, i.e. 80 watts or more. As will be seen, the cooling assembly 32 is actually mounted directly to the top of chip 18.

As best seen in FIG. 2, cooling assembly 32 comprises a thermally conductive heat sink shown generally at 33 and comprised of a channel 34. That channel has a generally rectangular bottom wall 34a and a pair of opposite side walls 34b, 34b extending up from the bottom wall. The channel is topped off by a top wall or cover 34c and the opposite ends of the heat sink remain open. Positioned within the channel is a heat exchange member 36 in the form of vertical fins or folds of sheet metal or other thermally conductive material, that member occupying substantially the entire internal volume channel 34. Preferably, the upper and lower surfaces of the heat exchange member 36 are braised or welded to the upper and lower walls of channel 34 so that the channel and heat exchange member are an intimate thermal contact with each other.

Still referring to FIG. 2, a pair of laterally spaced-apart holes 38 are provided in the top wall 34c of channel 34. Collinear holes 39 are also provided in the housing bottom wall 34a as well as through the heat exchange member 36. These holes are adapted to receive the threaded posts 20 projecting up from CPU chip 18 as will be described later.

The housing top wall 34c is formed with a relatively large end extension 42 which overhangs the right-hand end of channel 34 to provide a mounting surface for a low profile electric centrifugal blower shown generally at 44. The blower 44 includes a housing 46 having a large area inlet opening 48 in the bottom wall of the housing and an exit opening 52 at the side of the housing facing heat sink 33, which opening has the same dimensions as the end openings into the heat sink channel 34. Blower housing 46 contains a motor driven rotor 54 which, when operating, draws air into the housing through opening 48 and expels the air through the exit opening 52. Blower 44 may be secured to the underside of the channel top wall extension 42 by means of suitable fasteners. Thus, in the illustrated assembly, a pair of long internally threaded headed pins 56 extend up through vertical passages 58 at opposite sides of the blower housing 46 and through registering holes 62 in extension 42. The pins 56 are held in place by threaded fasteners 64 screwed into the upper ends of posts 56. When blower 44 is secured to extension 42 thusly, its exit opening 52 is aligned with the adjacent end opening into heat sink channel 34.

After the blower 44 is secured to the heat sink 33 as aforesaid, that subassembly is mounted directly to the top of the CPU chip 18. More particularly, the subassembly is positioned so that the holes 39, 38 in the heat sink are aligned with the threaded posts 20 extending up from the CPU chip and lowered onto the chip so that the bottom wall 34a of the heat sink channel 34 is flush against the top of the chip 18 with the posts 20 projecting up through the openings 39 in the bottom wall 34a of channel 34. Heat sink 33 is releasably secured to the CPU chip by a pair of barrel nuts 72 which are passed down through the openings 38 in the channel top wall 34c and threaded onto posts 20. Enlargements at the ends of each nut engage the top and bottom walls of channel 34 thereby pressing the channel against CPU chip 18 thereby obtaining good thermal contact between the heat sink 33 and the chip 18.

When the cooling assembly 32 is secured thusly to chip 18, it is important to note that blower 44 extends out beyond the edge of motherboard 16 so that the blower inlet opening 48 is completely unobstructed. Accordingly, cooling air $A_{IN}$ can flow freely into the blower and be expelled through the heat sink 33 at a relatively high volumetric rate of flow. Thus heat can be drawn efficiently and effectively away from CPU chip 18. This placement of the blower also maximizes the length of channel 34 and thus of the finned heat exchange member 36 therein.

Referring to FIGS. 1 to 3, in order to further efficiently direct the flow of cooling air past chip 18, the cooling assembly also includes a baffle member shown generally at 74 which provides a defined flow path for the heated air $A_{OUT}$ exiting cooling assembly 32 on the way to the exhaust fan 26 (FIG. 1).

Baffle member 74 may be a simple inexpensive plastic part which is relatively flexible. It comprises a generally rectangular top wall 76 whose dimensions are more or less the same as those of the housing top wall 34c. Member 74 also includes a pair of walls 78a and 78b which extend down from top wall 76 at the front and rear edges thereof. Member 74 is dimensioned so that when top wall 76 is placed flush against the top wall 34c of the heat sink 33, walls 78a and 78b extend down in front of and behind the heat sink housing 34 as shown in FIG. 3. A pair of holes 82 are provided in top wall 76 to provide clearance for the tops of the barrel nuts 72.

The front wall 78a of the baffle member 74 is provided with a generally rectangular extension 84 at the left hand end of the baffle member. Also, the top wall 76 is provided with relatively large end extension 86 at the right hand end of the baffle member, the dimensions of extension 86 being more or less the same as those of top wall extension 42 of the heat exchanger. Furthermore, extension 86 is provided with a depending skirt 88 which extends down vertically from extension 86 at the rear of the baffle member. As shown in FIG. 2, skirt 88 extends well beyond the right hand end of extension 86.

For ease of manufacture, baffle member may be formed as a flat sheet and bent to the shape shown in FIG. 2. To retain that shape, extension 86 is provided with a flap 86a which engages under the right hand end of the top wall 76 and a second, forwardly extending flap 86b is secured by a fastener 90 to a tab 76a extending from the right hand end of wall 76.

When the baffle member 74 is seated on heat sink 33 fastened to CPU 18, the flexible extension 84 is flexed or bent so that it forms a rounded inside corner between the outlet end of the channel 34 and the flat surface of the adjacent computer component 22a as shown in FIGS. 1 and 3. In a similar manner, the member skirt 88 is flexed rearwardly so that its free end bears against the flat side-wall of power supply 12 as shown in those same drawing figures. Preferably, extension 84 and skirt 88 extend the full height of the enclosure 10 interior. The baffle member may be held in place simply by frictional engagement with the heat sink 33 or by suitable threaded fasteners (not shown).

When fans 24 and 26 and cooling assembly 32 are in operation, air is drawn into enclosure 10 as shown by the arrows $A_{IN}$ in FIG. 1, with the flow of that incoming air being directed to the inlet opening 48 of blower 44. That cooling air is sucked into the blower and discharged through the heat sink 33 at a relatively high flow rate thereby efficiently and effectively conducting heat away from the heat sink and CPU chip 18 in intimate thermal contact therewith. The heated air $A_{OUT}$ from the heat exchanger is redirected 90° by extension 84 along a defined flow path toward the exhaust fan 26 thereby minimizing the formation of eddies that could reduce the flow rate. As the heated air $A_{OUT}$ nears exhaust fan 26, it is again redirected 90° by skirt 88 directly into fan 26 so that the flow rate of the heated air exiting enclosure 10 is maximized. Also, the full height skirt 88 prevents recirculation of that heated air from the heat sink 33 back to the blower inlet 48. Thus, the low profile cooling assembly 32 enables the use of a high power CPU chip in an enclosure 10 which is thin enough to be used for a desk top or lap top computer or other low profile electronic device.

It will thus be seen that the objects set forth above, among those made apparent from the preceding description, are efficiently attained. Also, since certain changes may be made in the above construction without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention described herein.

What is claimed is:

1. A cooling assembly for cooling a CPU on a motherboard in an electronic device, said assembly comprising:

a channel-shaped heat sink having a flat first wall, an opposite wall, open first and second ends and internal heat exchange fins extending between said walls and said ends;

an electric blower having an inlet and an outlet;

means mounting the blower to the heat sink so that the blower outlet is aligned with the first end of the heat sink, and means anchoring the heat sink to the CPU so that the first wall of the heat sink is flush against the CPU and the blower inlet overhangs an edge of the motherboard.

2. The assembly defined in claim 1 wherein the mounting means comprise an end extension of said opposite wall which overhangs the first end of the heat sink, and means fastening the blower to said end extension.

3. The assembly defined in claim 1 wherein the anchoring means comprise at least one threaded post extending from the CPU and a corresponding number of holes in the first wall of the heat sink, each hole being sized to receive a said post, and a nut threaded onto said at least one post and tightened down against said first wall of the heat sink.

4. The assembly defined in claim 3 wherein the anchoring means include a plurality of said posts, holes and nuts.

5. The assembly defined in claim 3 wherein the nut on said at least one post nut is a threaded barrel nut that extends through a hole in the opposite wall of the heat sink that is collinear to the corresponding hole in the first wall thereof so that when the barrel nut is tightened on said at least one post, it engages both the first and opposite walls of the heat sink.

6. The assembly defined in claim 1 and further including a baffle member, said baffle member having a top wall and a pair of opposite first and second walls depending from the top wall, said baffle member being sized to engage over the opposite-wall of the heat sink, said baffle having flexible end extensions which extend in opposite directions from the top wall so that when the baffle member is seated on the heat sink, said first end extension has a free end located appreciably beyond the second end of the heat sink and the second end extension has a free end located appreciably beyond the first end of the heat sink;

means for maintaining the free end of the first end extension opposite the second end of the heat exchanger sink so that the first end extension forms an inside corner at the second end of the heat sink, and means for maintaining the free end of the second end extension away from the first end of the heat sink so that the second end extension forms an outside corner at the first end of the heat sink.

7. The assembly defined in claim 6 and further including:

an inlet fan for conducting air to the blower inlet, and an outlet fan for drawing air away from the second end of the heat sink.

* * * * *

UNITED STATES PATENT AND TRADEMARK OFFICE
CERTIFICATE OF CORRECTION

PATENT NO. : 6,317,319 B1
DATED : November 13, 2001
INVENTOR(S) : Jeffrey M. Lewis et al.

It is certified that error appears in the above-identified patent and that said Letters Patent is hereby corrected as shown below:

<u>Title page,</u>
Item [75], Inventors, change "Michael R. Rolla" to -- Michael P. Rolla --

Signed and Sealed this

Sixth Day of August, 2002

Attest:

Attesting Officer

JAMES E. ROGAN
*Director of the United States Patent and Trademark Office*